United States Patent
Tsunetsugu (10) Patent No.: US 10,763,851 B2
(45) Date of Patent: Sep. 1, 2020

(54) GATE CONTROL CIRCUIT AND TRANSISTOR DRIVE CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventor: Yukio Tsunetsugu, Yokohama Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/559,106

(22) Filed: Sep. 3, 2019

(65) Prior Publication Data
US 2020/0220539 A1 Jul. 9, 2020

(30) Foreign Application Priority Data
Jan. 4, 2019 (JP) ................................. 2019-000283

(51) Int. Cl.
H03K 17/567 (2006.01)
H03K 17/60 (2006.01)
H03K 19/0185 (2006.01)

(52) U.S. Cl.
CPC ........... *H03K 17/567* (2013.01); *H03K 17/60* (2013.01); *H03K 19/018507* (2013.01)

(58) Field of Classification Search
CPC ................. H03K 17/60; H03K 17/567; H03K 19/018507; H03K 17/58; H03K 17/302; H03K 19/0185; H03K 19/013; H03K 19/0136; H03K 19/0133
See application file for complete search history.

(56) References Cited

U.S. PATENT DOCUMENTS

| 7,358,968 | B2 | 4/2008 | Sasada et al. |
| 7,688,049 | B2* | 3/2010 | Iwabuchi .............. H02M 7/538 323/271 |
| 8,648,630 | B2* | 2/2014 | Yang .................... H03K 17/063 327/109 |
| 2008/0283965 | A1* | 11/2008 | Nakamura .......... H01L 27/0921 257/532 |
| 2016/0276933 | A1* | 9/2016 | Saito ................ H03K 19/01750 |

FOREIGN PATENT DOCUMENTS

| JP | 3915815 B2 | 5/2007 |
| JP | 4091038 B2 | 5/2008 |
| JP | 5530669 B2 | 6/2014 |

* cited by examiner

*Primary Examiner* — Patrick C Chen
(74) *Attorney, Agent, or Firm* — White & Case LLP (57) ABSTRACT

A gate control circuit has a first gate controller that controls a gate voltage of a first transistor connected between a first reference voltage node and an output node on the basis of a potential difference between the first reference voltage node and a second reference voltage node, a second gate controller that controls a gate voltage of a second transistor connected between the output node and a fourth reference voltage node. and a voltage adjustment circuit that temporarily increases the potential difference between the first reference voltage node and the second reference voltage node in a first period in which the voltage of the first reference voltage node is rising from an initial voltage and a second period in which the voltage of the first reference voltage node is falling from a normal voltage.

20 Claims, 4 Drawing Sheets

GATE CONTROL CIRCUIT AND TRANSISTOR DRIVE CIRCUIT

CROSS REFERENCE TO RELATED APPLICATIONS

This application is based upon and claims the benefit of priority from the prior Japanese Patent Application No. 2019-000283, filed on Jan. 4, 2019, the entire contents of which are incorporated herein by reference.

FIELD

An embodiment of the present invention relates to a gate control circuit and a transistor drive circuit.

BACKGROUND

In a power semiconductor device such as an insulated gate bipolar transistor (IGBT) that switches a high current, a high voltage of 10 V or more needs to be applied to a gate of the power semiconductor device. For this reason, the gate of the power semiconductor device is generally controlled by a high side transistor and a low side transistor.

When the high side transistor and the low side transistor are turned on at the same timing, a through current flows between a power supply voltage node and a ground node, resulting in power loss. Therefore, control is required so that the high side transistor and the low side transistor are not simultaneously turned on.

As an example of the control for preventing the high side transistor and the low side transistor from being simultaneously turned on, a gate voltage of the high side transistor and a gate voltage of the low side transistor are monitored. That is, in a case of turning on the high side transistor, first, the low side transistor is turned off and it is confirmed by the gate voltage of the low side transistor that the low side transistor has been turned off, a logical product operation is performed on a low side turn-off signal and a high side turn-on signal, and the high side turn-on signal is transmitted to the high side transistor by a boost level shift circuit to turn on the high side transistor. In a case of turning on the low side transistor, first, the high side transistor is turned off and it is confirmed by the gate voltage of the high side transistor that the high side transistor has been turned off, a signal is transmitted to the low side transistor by a buck level shift circuit, and a logical product operation is performed on the signal and a high side turn-off signal to turn off the low side transistor.

However, at the time of supplying power of a high side power supply VCC, at the time of blocking the supply of the power, or the like, a power supply voltage is temporarily decreased, and thus, there is a possibility that the two level shift circuits described above will not be normally operated and monitor signals cannot be correctly transmitted. When the power of VCC is rapidly decreased in a state where the high side transistor is turned on, in a case where there is no monitoring circuit for a potential difference (VCC-Hs_GND) of a high side floating power supply, if a low side turn-on signal is input, there is a possibility that a high side turn-off monitoring signal will not be stabilized, and the high side transistor and the low side transistor will be turned on, such that a through current will flow.

In addition, it is assumed that there is a monitoring circuit for the potential difference (VCC-Hs_GND) of the high side floating power supply, such that the high side transistor can be turned off. When the buck level shift circuit transmitting a turn-off state of the high side transistor to the low side transistor is not operated, the low side transistor is maintained in a turn-off state, and an output terminal OUT for driving an external transistor becomes a high impedance. If the external transistor is a metal oxide semiconductor (MOS) gate transistor, a gate voltage of the external transistor is not stabilized and an uncontrollable current flows. In order to avoid such a problem, another system that lowers OUT by a monitoring signal between VCC and GND is required. Two systems between VCC and Hs_GND and between VCC and GND are required for monitoring the power supply.

Further, in an application of a switching power supply, the power supply is temporarily interrupted for several microseconds due to a lightning surge, such that there is a demand that a turn-on state of the high side transistor is maintained for a certain time under conditions such as VCC of about 2.4 V and a low temperature of −45° C., and the high side transistor is then turned off. When the buck level shift circuit is not stabilized, the turn-on state of the high side transistor cannot be maintained. Therefore, it is necessary to secure the potential difference (VCC-Hs_GND) of the high side floating power supply even though the power supply voltage is low (2.4 V<VCC<4 V) and a temperature is low (−45° C.).

DETAILED DESCRIPTION

A gate control circuit according to one embodiment has:

a first gate controller that controls a gate voltage of a first transistor connected between a first reference voltage node and an output node on the basis of a potential difference between the first reference voltage node and a second reference voltage node having a voltage lower than a voltage of the first reference voltage node;

a second gate controller that controls a gate voltage of a second transistor connected between the output node and a fourth reference voltage node on the basis of a potential difference between a third reference voltage node having a voltage lower than the voltage of the first reference voltage node and the fourth reference voltage node having a voltage lower than the voltage of the third reference voltage node; and a voltage adjustment circuit that temporarily increases the potential difference between the first reference voltage node and the second reference voltage node in a first period in which the voltage of the first reference voltage node is rising from an initial voltage and a second period in which the voltage of the first reference voltage node is falling from a normal voltage.

Hereinafter, embodiments will be described with reference to the drawings. It should be noted that in the present specification and the accompanying drawings, some components are omitted, changed or simplified for the purpose of ease of understanding and convenience of illustration, but technical contents that can expect similar functions are also interpreted to be included in the present embodiment. Further, in the accompanying drawings of the present specification, for the purpose of ease of understanding and convenience of illustration, appropriate scales, vertical and horizontal dimensional ratios, and the like, are changed and exaggerated.

Figure 1:
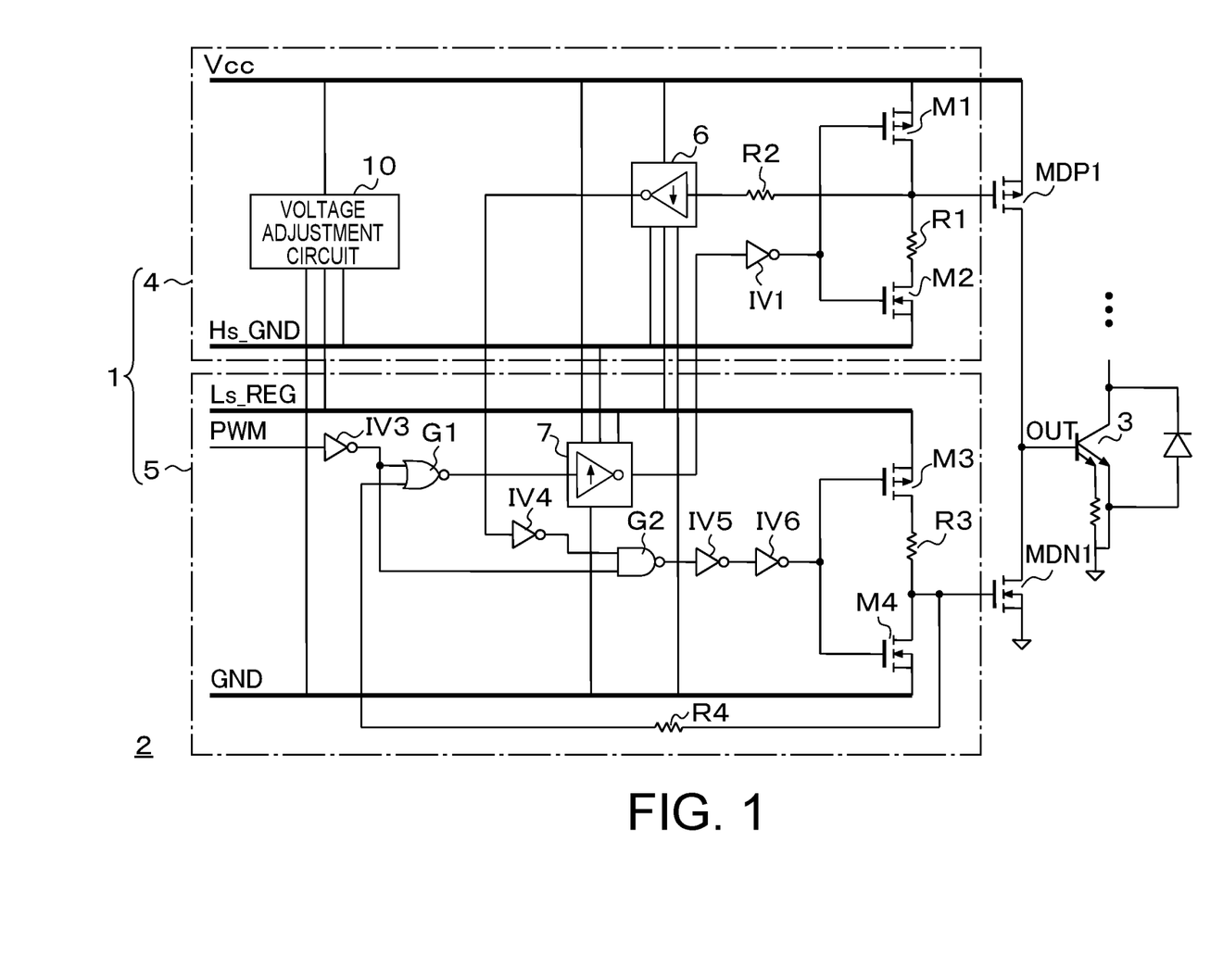
FIG. 1 is a circuit diagram of a transistor drive circuit including a gate control circuit according to an embodiment.

FIG. 1 is a circuit diagram of a transistor drive circuit 2 including a gate control circuit 1 according to an embodiment. In FIG. 1, main circuit elements in the gate control circuit 1 and the transistor drive circuit 2 are illustrated. Actually, there can be various circuit elements that are not illustrated in FIG. 1. The gate control circuit 1 is included in a part of the transistor drive circuit 2.

The transistor drive circuit 2 of FIG. 1 is a circuit for driving a power semiconductor device 3 such as an insulated gate bipolar transistor (IGBT). The power semiconductor device 3 is generally externally attached to the transistor drive circuit 2.

The transistor drive circuit 2 includes a first transistor MDP1 of a high side and a second transistor MDN1 of a low side.

The first transistor MDP1 is a p-channel metal oxide semiconductor (PMOS) transistor connected between a first reference voltage node VCC and an output node OUT. More specifically, a source of the first transistor MDP1 is connected to the first reference voltage node VCC, and a drain of the first transistor MDP1 is connected to the output node OUT. A gate of the power semiconductor device 3 is connected to the output node OUT. It should be noted that a resistor may be connected between the drain of the first transistor MDP1 and the output node OUT.

A first gate control unit 4 is connected to a gate of the first transistor MDP1. The first gate control unit 4 controls a gate voltage of the first transistor MDP1 connected between the first reference voltage node VCC and the output node OUT on the basis of a potential difference between the first reference voltage node VCC and a second reference voltage node Hs_GND having a voltage lower than that of the first reference voltage node VCC.

The second transistor MDN1 is an n-channel metal oxide semiconductor (NMOS) transistor connected between the output node OUT and a fourth reference voltage node GND. More specifically, a drain of the second transistor MDN1 is connected to the output node OUT, and a source of the second transistor MDN1 is connected to the fourth reference voltage node GND. A resistor may be connected between the drain of the second transistor MDN1 and the output node OUT.

A second gate control unit 5 is connected to a gate of the second transistor MDN1. The second gate control unit 5 controls a gate voltage of the second transistor MDN1 connected between the output node OUT and the fourth reference voltage node GND on the basis of a potential difference between a third reference voltage node Ls_REG having a voltage lower than that of the first reference voltage node VCC and the fourth reference voltage node GND having a voltage lower than that of the third reference voltage node Ls_REG.

The first gate control unit 4 includes a first level shift circuit 6. The first level shift circuit 6 converts the gate voltage of the first transistor MDP1 into a voltage level corresponding to an operating voltage of the second gate control unit 5 and inputs the gate voltage whose voltage level is converted to the second gate control unit 5.

The second gate control unit 5 includes a second level shift circuit 7. The second level shift circuit 7 converts the gate voltage of the second transistor MDN1 into a voltage level corresponding to an operating voltage of the first gate control unit 4 and inputs the gate voltage whose voltage level is converted to the first gate control unit 4.

The first gate control unit 4 controls the gate voltage of the first transistor MDP1 on the basis of the gate voltage of the second transistor MDN1 whose voltage level is converted by the second level shift circuit 7. The second gate control unit 5 controls the gate voltage of the second transistor MDN1 on the basis of the gate voltage of the first transistor MDP1 whose voltage level is converted by the first level shift circuit 6.

More specifically, the first gate control unit 4 includes a PMOS transistor M1, a resistor R1, and an NMOS transistor M2 connected between the first reference voltage node VCC and the second reference voltage node Hs_GND. A source of the PMOS transistor M1 is connected to the first reference voltage node VCC, a drain of the PMOS transistor M1 is connected to one end of the resistor R1, the other end of the resistor R1 is connected to a drain of the NMOS transistor M2, and a source of the NMOS transistor M2 is connected to the second reference voltage node Hs_GND.

A connection node between the drain of the PMOS transistor M1 and the resistor R1 is connected to the gate of the first transistor MDP1. In addition, a voltage of this connection node is input to the first level shift circuit 6 through a resistor R2 and is converted to a voltage level of the low side.

An output node of an inverter IV1 is connected to both gates of the PMOS transistor M1 and the NMOS transistor M2. The inverter IV1 inverts an output signal of the second level shift circuit 7 in the second gate control unit 5 and outputs the inverted signal from the output node OUT.

The second gate control unit 5 includes a PMOS transistor M3, a resistor R3, an NMOS transistor M4, a resistor R4, a NOR gate G1, inverters IV3 and IV4, and a NAND gate G2, and inverters IV5 and IV6, in addition to the second level shift circuit 7.

A source of the PMOS transistor M3 is connected to the third reference voltage node Ls_REG, a drain of the PMOS transistor M3 is connected to one end of the resistor R3, the other end of the resistor R3 is connected to a drain of the NMOS transistor M4, and a source of the NMOS transistor M4 is connected to the fourth reference voltage node GND.

A connection node between the resistor R3 and the drain of the NMOS transistor M4 is connected to the gate of the second transistor MDN1. In addition, a voltage of this connection node is input to the NOR gate G1 through the resistor R4. The NOR gate G1 outputs an inverted signal of a logical sum of a signal obtained by inverting a pulse width modulation (PWM) signal for controlling turn-on/off of the first transistor MDP1 and the second transistor MDN1 by the inverter IV3 and the gate of the second transistor MDN1. The output signal of the NOR gate G1 is subjected to conversion in a voltage level by the second level shift circuit 7 and is input to the inverter IV1 in the first gate control unit 4.

Each circuit element in the first gate control unit 4 receives a power supply voltage supplied from the first reference voltage node VCC with the second reference voltage node Hs_GND being at a ground level. Each circuit element in the second gate control unit 5 receives a power supply voltage supplied from the third reference voltage node Ls_REG with the fourth reference voltage node GND being at a ground level. The first to fourth reference voltage nodes Vcc, Hs_GND, Ls_REG, and GND are connected to each of the first level shift circuit 6 and the second level shift circuit 7.

Next, operations of the first gate control unit 4 and the second gate control unit 5 of FIG. 1 will be described. In a case where voltages of the first reference voltage node VCC and the third reference voltage node Ls_REG are normal voltages, when the PWM signal becomes high, an output of the inverter IV3 becomes a low level, an output of the NAND gate G2 becomes a high level, and an output of the inverter IV6 becomes a high level. Therefore, the second transistor MDN1 is turned off, both inputs of the NOR gate G1 become a low level, and the output of the NOR gate G1 becomes a high level. Accordingly, an output of the second level shift circuit 7 becomes a low level voltage. Therefore, an output of the inverter IV1 in the first gate control unit 4 becomes a high level, such that the NMOS transistor M2 is turned on. Therefore, the first transistor MDP1 is turned on. In this way, when the PWM signal becomes a high level, the second transistor MDN1 is turned off, the first transistor MDP1 is turned on, the output node OUT becomes a high level voltage, such that the power semiconductor device 3 is turned on.

On the other hand, in a case where voltages of the first reference voltage node VCC and the third reference voltage node Ls_REG are normal voltages, when the PWM signal becomes a low level, an output of the inverter IV3 becomes a high level, the output of the NOR gate G1 becomes a low level, the output of the second level shift circuit 7 becomes a high level voltage, and an output of the inverter IV1 in the first gate control unit 4 becomes low. Therefore, the PMOS transistor M1 is turned on and the gate of the first transistor MDP1 becomes a high level, such that the first transistor MDP1 is turned off. At this time, an output of the inverter IV4 in the second gate control unit 5 becomes a low level, such that both inputs of the NAND gate G2 in the second gate control unit 5 become high level, the output of the NAND gate G2 becomes a low level, and the output of the inverter IV6 becomes a low level. Therefore, the PMOS transistor M3 is turned on, and the gate of the second transistor MDN1 becomes a high level. Therefore, the first transistor MDP1 is turned off, the second transistor MDN1 is turned on, the output node OUT becomes a low level voltage, such that the power semiconductor device 3 is turned off.

The gate control circuit 1 includes a voltage adjustment circuit 10, in addition to the first gate control unit 4 and the second gate control unit 5 described above.

The voltage adjustment circuit 10 temporarily increases a potential difference between the first reference voltage node VCC and the second reference voltage node Hs_GND in a first period in which the first reference voltage node VCC is rising and a second period in which the first reference voltage node VCC is falling. The voltage adjustment circuit 10 stops an operation of temporarily increasing the potential difference between the first reference voltage node and the second reference voltage node in a period other than the first period and the second period. A voltage of the first reference voltage node when the first period ends is lower than the normal voltage, and a voltage of the first reference voltage node when the second period ends is higher than that of the second reference voltage node.

The voltage adjustment circuit 10 may make a level of the first reference voltage node VCC at which the first period ends and a level of the first reference voltage node VCC at which the second period starts different from each other. By making the level of the first reference voltage node VCC at which the first period ends and the level of the first reference voltage node VCC at which the second period starts different from each other, it is possible to prevent chattering that the potential difference between the first reference voltage node VCC and the second reference voltage node Hs_GND becomes unstable.

Figure 2:
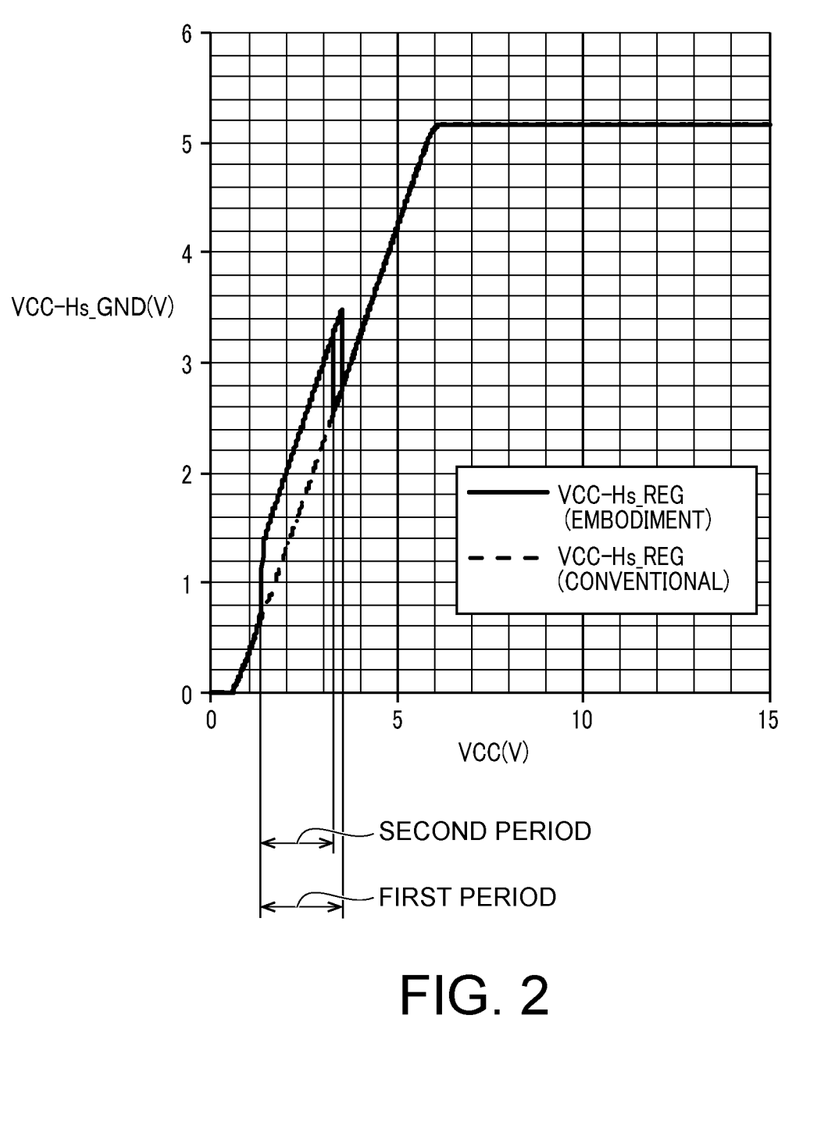
FIG. 2 is a graph illustrating an example of a first period and a second period.

FIG. 2 is a graph illustrating an example of the first period and the second period. A horizontal axis in FIG. 2 is the first reference voltage node VCC [V], and a vertical axis in FIG. 2 is the potential difference [V] between the first reference voltage node VCC and the second reference voltage node Hs_GND. A solid line waveform of FIG. 2 is a potential difference according to the present embodiment, and a broken line waveform of FIG. 2 is a conventional waveform in which a boost operation of a potential difference is not performed. As illustrated by the solid line waveform of FIG. 2, in the present embodiment, the potential difference in the first period and the second period described above is boosted, and a first reference voltage corresponding to a time at which the first period ends is shifted from a first reference voltage corresponding to a time at which the second period starts.

Figure 3:
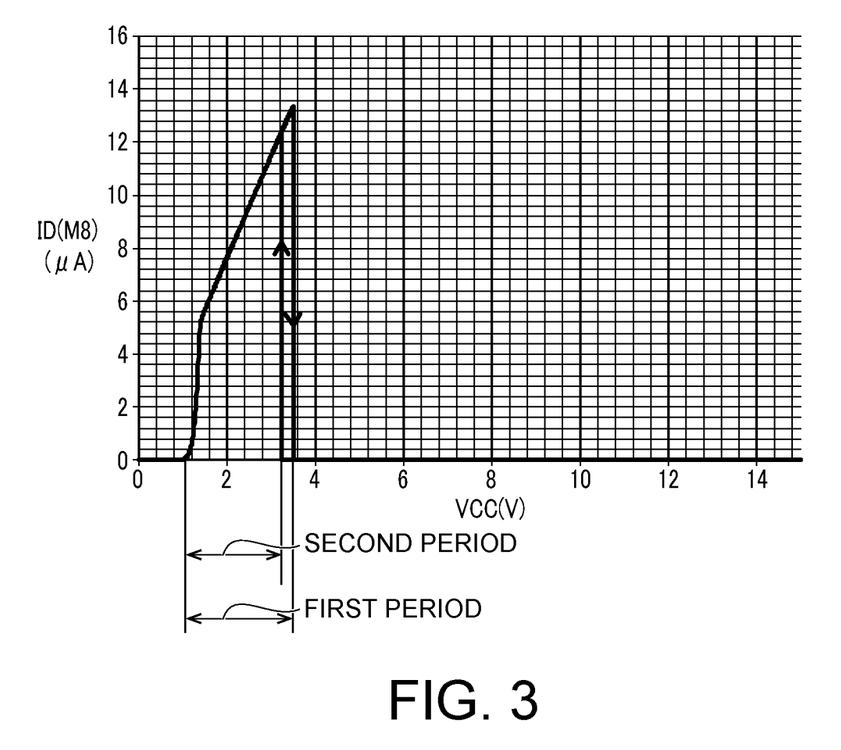
FIG. 3 is a graph illustrating a relationship between a first reference voltage node and a current flowing from a second reference voltage node to a fourth reference voltage node.

FIG. 3 is a graph illustrating a relationship between the first reference voltage node VCC and a current flowing from the second reference voltage node Hs_GND to the fourth reference voltage node GND. A horizontal axis in FIG. 3 is the first reference voltage node VCC [V], and a vertical axis in FIG. 3 is a current [μA].

As illustrated by an arrow in FIG. 3, changes in a potential difference and a current when the first reference voltage node VCC is gradually increased from 0 V, and changes in a potential difference and a current when the first reference voltage node VCC is gradually decreased from the normal voltage are partially different from each other to have hysteresis.

Figure 4:
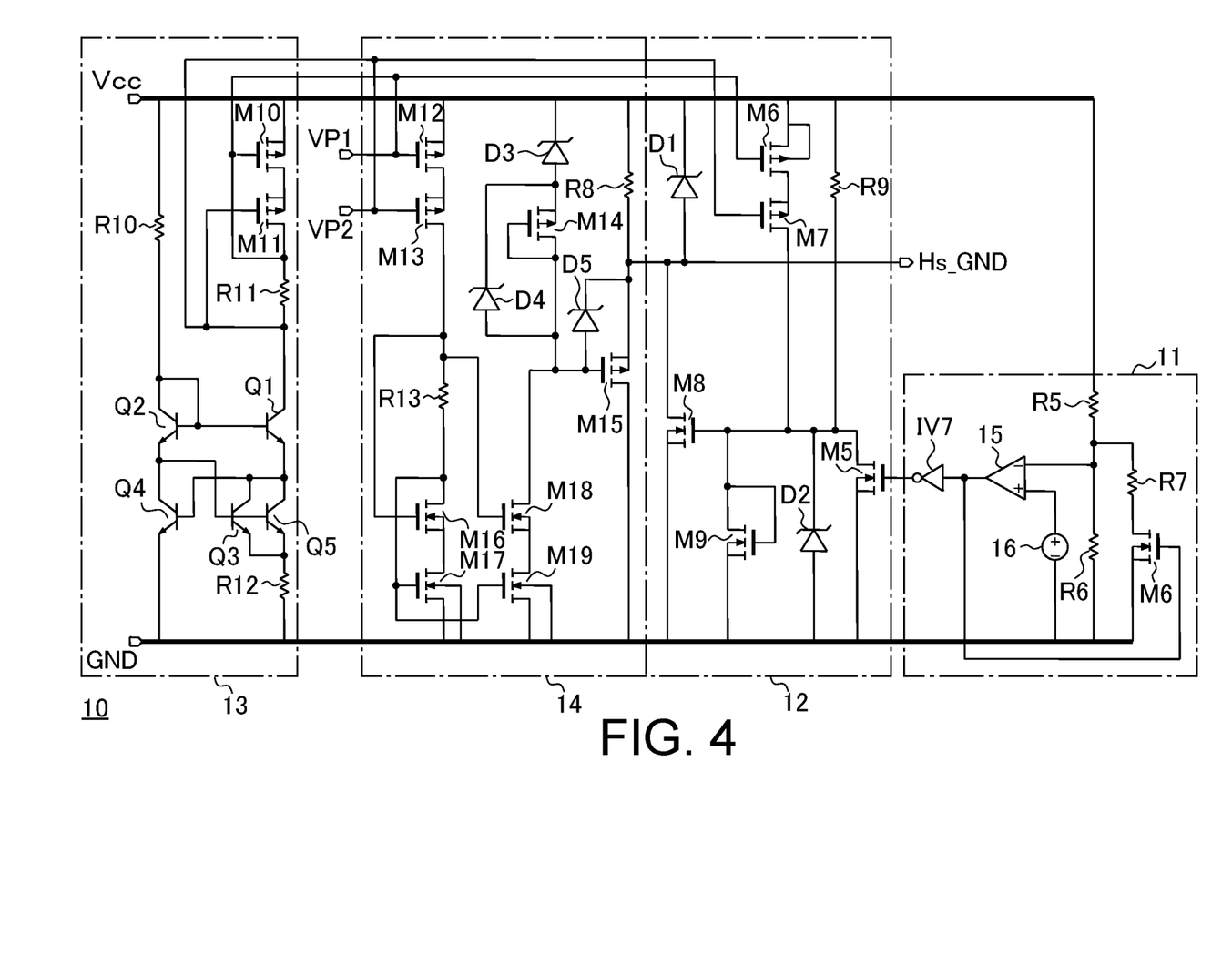
FIG. 4 is a circuit diagram illustrating an example of an internal configuration of a voltage adjustment circuit.

FIG. 4 is a circuit diagram illustrating an example of an internal configuration of the voltage adjustment circuit 10. As illustrated in FIG. 4, the voltage adjustment circuit 10 may include a boost timing control circuit 11, a first current generation circuit 12, a current source 13, and a second current generation circuit 14.

The boost timing control circuit 11 generates a boost timing signal that becomes a first logic until the first reference voltage node VCC starts to rise from an initial voltage to become a first voltage, a second logic when the first reference voltage node VCC exceeds the first voltage, the second logic until the first reference voltage node VCC starts to fall from the normal voltage to become a second voltage, and the first logic when the first reference voltage node VCC becomes the second voltage or less. A magnitude relationship between the first voltage and the second voltage is arbitrary. The first period described above ends when a voltage of the first reference voltage node exceeds the first voltage, and the second period starts when the voltage of the first reference voltage node becomes the second voltage.

The first current generation circuit 12 causes a current to flow from the second reference voltage node Hs_GND to the fourth reference voltage node GND, if the first reference voltage node VCC becomes equal to or higher than a third voltage lower than the first voltage and the second voltage, when the boost timing signal is the first logic.

The current source 13 generates a predetermined current when the first reference voltage node VCC is equal to or higher than a fourth voltage higher than the third voltage and lower than the first voltage and the second voltage. The second current generation circuit 14 causes a current to flow from the second reference voltage node Hs_GND to the fourth reference voltage node GND on the basis of a predetermined current.

The boost timing control circuit 11 includes resistors R5 to R7, an NMOS transistor M6, a differential amplifier 15, a voltage source 16, and an inverter IV7. The resistors R5 and R6 are connected to each other in series between the first reference voltage node VCC and the fourth reference voltage node GND. One end of the resistor R7 is connected to a connection node between the resistors R5 and R6, the other end of the resistor R7 is connected to a drain of the transistor M6, and a source of the transistor M6 is connected to the fourth reference voltage node GND. An output signal of the differential amplifier 15 is input to the gate of the transistor M6 and to the inverter IV7. The inverter IV7 inverts the output signal of the differential amplifier 15 and outputs a boost timing signal.

The connection node of the resistors R5 and R6 is connected to a negative input node of the differential amplifier 15. A voltage source 16 is connected to a positive input node of the differential amplifier 15. An output node of the differential amplifier 15 is connected to an input node of the inverter IV7. An output node of the inverter IV7 is connected to a gate of an NMOS transistor M5 in the first current generation circuit 12.

The first current generation circuit 12 includes a resistor (second resistor) R9, Zener diodes D1 and D2, PMOS transistors M6 and M7, and NMOS transistors M5, M8 and M9.

A resistor (first resistor) R8 and the Zener diode D1 are connected to each other in parallel between the first reference voltage node VCC and the second reference voltage node Hs_GND. The resistor R8 is a resistor used in common in the first current generation circuit 12 and the second current generation circuit 14. A drain of the transistor (third transistor) M8 is connected to the second reference voltage node Hs_GND, and a source of the transistor M8 is connected to the fourth reference voltage node GND.

The transistors M6 and M7 are cascode-connected to each other between the first reference voltage node VCC and a gate of the transistor M8. A resistor R9 is connected between the first reference voltage node VCC and a gate of the transistor M5.

The transistor M9, the Zener diode D2, and the transistor M5 are connected to each other in parallel between the gate of the transistor M8 and the fourth reference voltage node GND.

The current source 13 includes NPN transistors Q1 to Q5, resistors R10 to R12, and PMOS transistors M10 and M11. The resistor R10 and the transistors Q2 and Q4 are connected to each other in series between the first reference voltage node VCC and the fourth reference voltage node GND. In addition, the PMOS transistors M10 and M11, the resistor R11, the NPN transistors Q1 and Q5, and the resistor R12 are connected to each other in series between the first reference voltage node VCC and the fourth reference voltage node GND. Gates of the transistors Q1 and Q2 are common, and the transistors Q4, Q3 and Q5 and the resistor R12 make a current mirror circuit.

The second current generation circuit 14 includes PMOS transistors M12 to M15, NMOS transistors M16 to M19, a resistor R13, and Zener diodes D3 to D5.

The transistors M12 and M13 make a current mirror circuit with the transistors M10 and M11 in the current source 13. In addition, the transistors M12 and M13 make a current mirror circuit with the transistors M6 and M7. The transistors M16 and M17 make a current mirror circuit with the transistors M18 and M19.

Next, an operation of the voltage adjustment circuit 10 of FIG. 4 will be described. When the first reference voltage node VCC is gradually increased from 0 V, initially, an output of the differential amplifier 15 becomes a high level, and an output of the inverter IV7 becomes a low level. Thus, the transistor M5 is in a turn-off state.

The gate of the transistor M8 is connected to the first reference voltage node VCC through the resistor R9. When the first reference voltage node VCC is gradually increased, a gate voltage of the transistor M8, which is the other end of the resistor R9, is also gradually increased. When the gate voltage of the transistor M8 exceeds a threshold voltage of the transistor M8, a current flows from the first reference voltage node VCC between the drain and the source of the transistor M8 through the resistor R8. Therefore, a potential difference between the first reference voltage node VCC and the second reference voltage node Hs_GND is increased, such that a boost operation of the potential difference starts.

Meanwhile, the current source 13 in the second current generation circuit 14 starts to cause a predetermined current Ia to flow to the transistor Q1, when the first reference voltage node VCC becomes two times or more the base-emitter voltage VBE of the transistors Q3 to Q5. This current Ia is represented by the following Equation (1).

$$Ia = VT \times \ln(N)/R12 \qquad (1)$$

Here, VT is a thermoelectromotive voltage of the transistors Q1 to Q5, N is the number of transistors and is two (transistors Q3 and Q5) in a circuit of FIG. 4, and N=2.

The current Ia starts to flow when the first reference voltage node VCC exceeds approximately 2V, which is the sum of the respective voltages on a right side of the following Equation (2).

$$VCC = \text{Threshold Voltage } VTH \text{ of transistor } M10 + \\ \text{Source-Drain Voltage } VSD(M10)\_sat \text{ of Transistor } M10 \text{ in Saturated State} + \text{Collector-Emitter} \\ \text{Voltage } VCE(Q1)\_sat \text{ of Transistor } Q1 \text{ of} \\ \text{Drain-Source Voltage } VSD(M11)\_sat \text{ of } M11 + \\ \text{Collector-Emitter Voltage of Transistors } Q3 \text{ and} \\ Q5 \qquad (2)$$

Here, VSD (M10)_sat and VCE (Q5)_sat on the right side of Equation (2) are represented by the following Equations (3) and (4), respectively.

$$VSD(M10)\_sat = R11 \times Ia \qquad (3)$$

$$VCE(Q5)\_sat = VBE(Q2) \qquad (4)$$

A minimum voltage VCC min 1 of the first reference voltage node VCC of Equation (2) is represented by the following Equation (5).

$$VCC \text{ min } 1 = VSD(M10)\_sat + VSD(M11)\_sat + VCE \\ (Q1)\_sat + VCE(Q5)\_sat = 1V + 0.15V + 0.15V + \\ 0.7V = \text{about } 2V \qquad (5)$$

The source-drain voltage VSD_sat of the transistor M10 in a saturated state is a self-bias, and is biased by the resistor R11×Ia.

A minimum voltage VCC min 2 of the first reference voltage node VCC at which the transistors M12 and M13, the resistor R13, and the transistors M16 and M17 in the second current generation circuit 14 are operated are represented by the following Equation (6).

$$VCC \text{ min } 2 = VSD(M12)\_sat \text{ of Transistor } M12 + VSD \\ (M13)\_sat \text{ of Transistor } M13 + \text{Gate-Source Voltage } VGS(M16) \text{ of Transistor } M16 + \\ VDS(M17)\_sat \text{ of Transistor } M17 \qquad (6)$$

VSD (M12)_sat on a right side of Equation (6) is represented by the following Equation (7).

$$VSD(M12)\_sat = R13 \times Ia \quad (7)$$

Therefore, the above Equation (6) is represented by the following Equation (8).

$$VCC\_min\ 2 = VSD(M12)\_sat + VSD(M13)\_sat + VGS(M16) + VDS(M17)\_sat = 1V + 0.1V \times 3 = 1.3V \quad (8)$$

As described above, since a voltage value of Equation (8) is lower than that of Equation (5), in a case where the first reference voltage node VCC becomes about 2 V of Equation (5), a current flows in the transistors M16 and M17, and a current flows in the transistors M18 and M19 that make the current mirror circuit with the transistors M16 and M17. At this time, since the Zener diode D5 connected between a gate and a source of the transistor M15 is not broken down, the gate of the transistor M15 has a voltage substantially equal to that of the fourth reference voltage node GND. Therefore, a current starts to flow from the resistor R8 between the source and a drain of the transistor M15.

At the same time, a source-drain current of the transistors M6 and M7 that make the current mirror circuit with the transistors M12 and M13 is increased, and this current flows between a drain and a source of the transistor M9. Since the transistor M9 makes a current mirror circuit with the transistor M8, a drain-source current of the transistor M8 is also increased. Therefore, a more current flows from the second reference voltage node Hs_GND to the fourth reference voltage node GND, such that a potential difference between the first reference voltage node VCC and the second reference voltage node Hs_GND is increased.

When the first reference voltage node VCC is further increased, a voltage at the connection node between the resistors R5, R6, and R7 in the boost timing control circuit 11 becomes higher than that of the voltage source 16, and an output of the differential amplifier 15 transits from a high level to a low level. Accordingly, the transistor M5 is turned on, and a voltage of the gate of the transistor M8 drops to a voltage of the fourth reference voltage node GND. Therefore, the drain-source current of the transistor M8 does not flow, such that the boost operation of the potential difference between the first reference voltage node VCC and the second reference voltage node Hs_GND illustrated in FIG. 2 is stopped.

Conversely, in a case where the first reference voltage node VCC is gradually decreased from the normal voltage, the transistor M5 is turned on and the transistor M6 in the boost timing control circuit 11 is turned off, and the output of the differential amplifier 15 thus transits from a low level to a high level at a point in time in which a voltage divided by the resistors R5 and R6 falls below the voltage of the voltage source 16. Therefore, the transistor M5 is turned off, such that a current flows from the resistor R8 between the drain and the source of the transistor M8, and the boost operation of the potential difference between the first reference voltage node VCC and the second reference voltage node Hs_GND thus starts.

As described above, in the present embodiment, in a case where a voltage level of the first reference voltage node VCC on the high side is temporarily decreased, for example, when the power is supplied or when the supply of the power is blocked, the boost operation of temporarily increasing the potential difference between the first reference voltage node VCC and the second reference voltage node Hs_GND is performed. Therefore, even though the first reference voltage node VCC is low, it is possible to prevent a defect that the transistor MDP1 of the high side and the transistor MDN1 of the low side are simultaneously turned on, such that a through current flows.

More specifically, in the present embodiment, the potential difference between the first reference voltage node VCC and the second reference voltage node Hs_GND is increased by causing a current to flow from the second reference voltage node Hs_GND to the fourth reference voltage node GND within the first period in which the first reference voltage node VCC starts to rise and the second period in which the first reference voltage node VCC starts to fall. In addition, by making the first reference voltage node VCC when the first period ends and the first reference voltage node VCC when the second period starts different from each other, the chattering of the potential difference described above is prevented. Therefore, even when the power is supplied or when the supply of the power is blocked, a through current does not flow from the high side transistor MDP1 to the low side transistor MDN1, such that stable gate control can be performed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A gate control circuit comprising:
    a first gate controller that controls a gate voltage of a first transistor connected between a first reference voltage node and an output node on the basis of a potential difference between the first reference voltage node and a second reference voltage node having a voltage lower than a voltage of the first reference voltage node;
    a second gate controller that controls a gate voltage of a second transistor connected between the output node and a fourth reference voltage node on the basis of a potential difference between a third reference voltage node having a voltage lower than the voltage of the first reference voltage node and the fourth reference voltage node having a voltage lower than the voltage of the third reference voltage node; and
    a voltage adjustment circuit that temporarily increases the potential difference between the first reference voltage node and the second reference voltage node in a first period in which the voltage of the first reference voltage node is rising from an initial voltage and a second period in which the voltage of the first reference voltage node is falling from a normal voltage.

2. The gate control circuit according to claim 1,
    wherein the voltage adjustment circuit temporarily increases the potential difference between the first reference voltage node and the second reference voltage node by causing a current to flow from the second reference voltage node to the fourth reference voltage node in the first period and the second period.

3. The gate control circuit according to claim 1,
    wherein the voltage adjustment circuit makes a voltage level of the first reference voltage node when the first period ends and a voltage level of the first reference voltage node when the second period starts different from each other.

4. The gate control circuit according to claim 1,
wherein the voltage adjustment circuit stops an operation of temporarily increasing the potential difference between the first reference voltage node and the second reference voltage node in a period other than the first period and the second period.

5. The gate control circuit according to claim 1,
wherein a voltage of the first reference voltage node when the first period ends is lower than the normal voltage, and
a voltage of the first reference voltage node when the second period ends is higher than a voltage of the second reference voltage node.

6. The gate control circuit according to claim 1, further comprising:
a first level shift circuit that converts the gate voltage of the first transistor to a voltage level corresponding to an operating voltage of the second gate controller and inputs the gate voltage whose voltage level is converted to the second gate controller; and
a second level shift circuit that converts the gate voltage of the second transistor to a voltage level corresponding to an operating voltage of the first gate controller and inputs the gate voltage whose voltage level is converted to the first gate controller,
wherein the first gate controller controls the gate voltage of the first transistor on the basis of the gate voltage of the second transistor whose voltage level is converted by the second level shift circuit, and
the second gate controller controls the gate voltage of the second transistor on the basis of the gate voltage of the first transistor whose voltage level is converted by the first level shift circuit.

7. The gate control circuit according to claim 1,
wherein the voltage adjustment circuit comprises a boost timing control circuit that generates a boost timing signal that becomes a first logic until a voltage of the first reference voltage node starts to rise from an initial voltage to become a first voltage, a second logic when a voltage of the first reference voltage node exceeds the first voltage, the second logic until a voltage of the first reference voltage node starts to fall from a normal voltage to become a second voltage, and the first logic when a voltage of the first reference voltage node becomes the second voltage or less, and
the voltage adjustment circuit sets the first period and the second period on the basis of the boost timing signal.

8. The gate control circuit according to claim 7,
wherein the first period ends when the voltage of the first reference voltage node exceeds the first voltage, and
the second period starts when the voltage of the first reference voltage node becomes the second voltage.

9. The gate control circuit according to claim 7,
wherein the voltage adjustment circuit comprises:
a first current generation circuit that causes a current to flow from the second reference voltage node to the fourth reference voltage node if the voltage of the first reference voltage node becomes equal to or higher than a third voltage lower than the first voltage and the second voltage when the boost timing signal is the first logic;
a current source that generates a predetermined current when the voltage of the first reference voltage node is equal to or higher than a fourth voltage higher than the third voltage and lower than the first voltage and the second voltage; and
a second current generation circuit that causes a current to flow from the second reference voltage node to the fourth reference voltage node on the basis of the predetermined current.

10. The gate control circuit according to claim 9,
wherein the first current generation circuit comprises:
a first resistor connected between the first reference voltage node and the second reference voltage node;
a third transistor connected between the second reference voltage node and the fourth reference voltage node; and
a second resistor connected between the first reference voltage node and a gate of the third transistor, and
the third transistor causes a current to flow from the second reference voltage node to the fourth reference voltage node when the boost timing signal is the first logic and the voltage of the first reference voltage node becomes equal to or higher than the third voltage.

11. A transistor drive circuit comprising:
a first transistor that is connected between a first reference voltage node and an output node;
a first gate controller that controls a gate voltage of the first transistor on the basis of a potential difference between the first reference voltage node and a second reference voltage node having a voltage lower than a voltage of the first reference voltage node;
a second transistor that is connected between the output node and a fourth reference voltage node having a voltage lower than a voltage of a third reference voltage node;
a second gate controller that controls a gate voltage of the second transistor on the basis of a potential difference between the third reference voltage node having a voltage lower than the voltage of the first reference voltage node and the fourth reference voltage node having a voltage lower than the voltage of the third reference voltage node; and
a voltage adjustment circuit that temporarily increases the potential difference between the first reference voltage node and the second reference voltage node in a first period in which the voltage of the first reference voltage node is rising and a second period in which the voltage of the first reference voltage node is falling.

12. The transistor drive circuit according to claim 11,
wherein the voltage adjustment circuit temporarily increases the potential difference between the first reference voltage node and the second reference voltage node by causing a current to flow from the second reference voltage node to the fourth reference voltage node in the first period and the second period.

13. The transistor drive circuit according to claim 11,
wherein the voltage adjustment circuit makes a voltage level of the first reference voltage node when the first period ends and a voltage level of the first reference voltage node when the second period starts different from each other.

14. The transistor drive circuit according to claim 11,
wherein the voltage adjustment circuit stops an operation of temporarily increasing the potential difference between the first reference voltage node and the second reference voltage node in a period other than the first period and the second period.

15. The transistor drive circuit according to claim 11,
wherein a voltage of the first reference voltage node when the first period ends is lower than the normal voltage, and a voltage of the first reference voltage node when the second period ends is higher than a voltage of the second reference voltage node.

16. The transistor drive circuit according to claim 11, further comprising:
   a first level shift circuit that converts the gate voltage of the first transistor to a voltage level corresponding to an operating voltage of the second gate controller and inputs the gate voltage whose voltage level is converted to the second gate controller; and
   a second level shift circuit that converts the gate voltage of the second transistor to a voltage level corresponding to an operating voltage of the first gate controller and inputs the gate voltage whose voltage level is converted to the first gate controller,
   wherein the first gate controller controls the gate voltage of the first transistor on the basis of the gate voltage of the second transistor whose voltage level is converted by the second level shift circuit, and
   the second gate controller controls the gate voltage of the second transistor on the basis of the gate voltage of the first transistor whose voltage level is converted by the first level shift circuit.

17. The transistor drive circuit according to claim 11, wherein the voltage adjustment circuit comprises a boost timing control circuit that generates a boost timing signal that becomes a first logic until a voltage of the first reference voltage node starts to rise from an initial voltage to become a first voltage, a second logic when a voltage of the first reference voltage node exceeds the first voltage, the second logic until a voltage of the first reference voltage node starts to fall from a normal voltage to become a second voltage, and the first logic when a voltage of the first reference voltage node becomes the second voltage or less, and
   the voltage adjustment circuit sets the first period and the second period on the basis of the boost timing signal.

18. The transistor drive circuit according to claim 17, wherein the first period ends when the voltage of the first reference voltage node exceeds the first voltage, and the second period starts when the voltage of the first reference voltage node becomes the second voltage.

19. The transistor drive circuit according to claim 17, wherein the voltage adjustment circuit comprises:
   a first current generation circuit that causes a current to flow from the second reference voltage node to the fourth reference voltage node if the voltage of the first reference voltage node becomes equal to or higher than a third voltage lower than the first voltage and the second voltage when the boost timing signal is the first logic;
   a current source that generates a predetermined current when the voltage of the first reference voltage node is equal to or higher than a fourth voltage higher than the third voltage and lower than the first voltage and the second voltage; and
   a second current generation circuit that causes a current to flow from the second reference voltage node to the fourth reference voltage node on the basis of the predetermined current.

20. The transistor drive circuit according to claim 19, wherein the first current generation circuit comprises:
   a first resistor connected between the first reference voltage node and the second reference voltage node;
   a third transistor connected between the second reference voltage node and the fourth reference voltage node; and
   a second resistor connected between the first reference voltage node and a gate of the third transistor, and
   the third transistor causes a current to flow from the second reference voltage node to the fourth reference voltage node when the boost timing signal is the first logic and the voltage of the first reference voltage node becomes equal to or higher than the third voltage.

* * * * *